United States Patent [19]

Solomon

[11] Patent Number: 5,093,708
[45] Date of Patent: Mar. 3, 1992

[54] MULTILAYER INTEGRATED CIRCUIT MODULE

[75] Inventor: Allen L. Solomon, Fullerton, Calif.

[73] Assignee: Grumman Aerospace Corporation, Bethpage, N.Y.

[21] Appl. No.: 570,135

[22] Filed: Aug. 20, 1990

[51] Int. Cl.$^5$ .................... H01L 23/48; H01L 21/302
[52] U.S. Cl. .......................................... 357/68; 357/55; 357/71; 437/66; 437/183; 437/203; 437/209
[58] Field of Search ............... 357/55, 68, 71; 437/66, 437/183, 203, 209

[56] References Cited

U.S. PATENT DOCUMENTS

| | | | |
|---|---|---|---|
| 3,400,210 | 9/1968 | Retmer | 174/ |
| 3,436,604 | 4/1969 | Hyltin et al. | 317/ |
| 4,304,624 | 12/1981 | Carson et al. | 156/ |
| 4,320,438 | 3/1982 | Ibrahim et al. | 361/ |
| 4,352,715 | 10/1982 | Carson et al. | 156/ |
| 4,354,107 | 10/1982 | Carson et al. | 250/ |
| 4,361,717 | 11/1982 | Gilmore et al. | 136/ |
| 4,371,744 | 2/1983 | Badet et al. | 174/ |
| 4,403,238 | 9/1983 | Clark | 357/ |
| 4,423,468 | 12/1983 | Gatto et al. | 361/ |
| 4,525,921 | 7/1985 | Carson et al. | 29/ |
| 4,551,629 | 11/1985 | Carson et al. | 250/ |
| 4,659,931 | 4/1987 | Schmitz et al. | 250/ |
| 4,670,770 | 6/1987 | Tai | 357/68 |
| 4,797,715 | 1/1989 | Thillays et al. | 357/30 |
| 4,974,041 | 11/1990 | Grinberg | 357/68 |

Primary Examiner—Edward J. Wojciechowicz
Attorney, Agent, or Firm—Stetina and Brunda

[57] ABSTRACT

A multilayer integrated circuit module for supporting integrated circuit chips and for interfacing the chips to external circuitry is disclosed. Each integrated circuit is formed to have conductive contact pads disposed upon beveled edges. The module is comprised of a base layer and a plurality of stacked layers having apertures formed therein and disposed upon the base layer such that at least one well is formed. The aperture defining inclined sidewalls with conductive conduits formed thereon. The inclined sidewalls are formed to support the integrated circuit chips upon the beveled surfaces thereof. The conductive conduits formed on the incline sidewalls contact the integrated circuit chip conductive contact pads. The base layer has conductive conduits formed thereon, the base layer further has vertically inclined surfaces spaced to receive and support the integrated circuit chips along beveled edge portions thereof. The base layer conductive conduits extend along the vertically inclined surfaces and contact the integrated circuit conductive contact pads. Thus, the integrated circuit chips are supported within the wells and are connected to the conductive conduits formed on the base layer and stacked layers solely by means of abutting electrical connection with the chip beveled edge portions. A pattern of conductive conduits formed upon the plurality of stacked layers interfaces the integrated circuit chip to external circuitry. Each of the stacked layers may have a pattern of conductive conduits formed thereon.

25 Claims, 8 Drawing Sheets

MULTILAYER INTEGRATED CIRCUIT MODULE

FIELD OF THE INVENTION

The present invention relates generally to integrated circuit wafer fabrication and more particularly to a multilayer integrated circuit module for supporting and interfacing integrated circuits to external circuitry.

BACKGROUND OF THE INVENTION

An ever increasing demand for more compact and faster integrated circuits has led to the design of various integrated circuit chip and substrate assemblies. One such chip and substrate assembly is disclosed in U.S. Pat. No. 4,670,770 issued to TAI on June 2, 1987 and entitled INTEGRATED CIRCUIT CHIP-AND-SUBSTRATE ASSEMBLY. The TAI Patent discloses an integrated circuit assembly which can be disposed within a well formed in a silicon substrate. The integrated circuit and well have complimentary beveled edges, preferably formed by anisotropic etching. The integrated circuit assembly is electrically connected to the well via conductive conduits formed upon the beveled edges of the integrated circuit and the well.

Conductive conduits can be formed upon the surface of the substrate to interconnect a plurality of integrated circuits and also to permit the interconnection of various integrated circuits and discrete components. Thus, compared to contemporarily packaged integrated circuit chips, e.g., DIP (dual in-line pin), SIP (single in-line pin) and PGA (pin grid array), disposed upon contemporary printed circuit boards, comparatively high circuit density and speed is achieved.

The use of a single layer substrate as disclosed by TAI limits the number of traces electrically connecting the integrated circuit to the substrate. The number of traces is limited to the fixed number of conductive conduits that can be formed upon the surface of the substrate without making each conductive conduit too thin to efficiently conduct or making the space between conduits so small that adjacent conduits react capacitively. The number of circuits that can be formed upon the integrated circuit chip is limited by the ability to connect those circuits to the substrate. Therefore, the number of circuits that can be formed upon the integrated circuit chip, and consequently the overall circuit density, is strictly limited by the ability to interconnect integrated circuits and to connect those circuits to external circuitry.

Although such integrated circuit chip and substrate assemblies have proven generally suitable for their intended purposes, they possess inherent deficiencies which detract from their overall effectiveness in the marketplace. Improvements in circuit density and speed are necessitated by the continuous technological advances which strive to obtain more functions and functions of greater complexity from smaller packages. In view of the shortcomings of the prior art, it is desirable to provide a means for increasing the number and density of conductive conduits which may interconnect integrated circuits and connect those integrated circuits to external circuitry.

As such, although the prior art has recognized to a limited extent the problem of increasing the density of integrated circuit chip and substrate assemblies, the proposed solutions have to date been ineffective in providing a satisfactory remedy.

SUMMARY OF THE INVENTION

The present invention specifically addresses and alleviates the above-mentioned deficiencies associated in the prior art, more particularly, the present invention comprises a multilayer integrated circuit module for supporting and interfacing integrated circuits to external circuitry. The multilayer integrated circuit module has a substrate well assembly within which may be disposed a plurality of individual integrated circuit chips. Each integrated circuit chip has conductive pads formed on beveled edges thereof.

The substrate well assembly is comprised of a base layer and a plurality of stacked layers disposed upon the base layer. At least one aperture extends through each stacked layer to form at least one well having inclined sidewalls. The base layer has conductive conduits formed thereon. The base layer further has vertically inclined surfaces formed upon elongate bumps. The elongate bumps are spaced sufficiently apart to receive and support the beveled edge portions of the integrated circuit chip upon the vertically inclined surfaces of the elongate bumps. The base layer conductive conduits extend over vertically inclined surfaces of the elongate bumps. The conductive conduits formed upon the base layer thus contact the pads formed upon the beveled surfaces of the integrated circuit chip.

Conductive conduits formed upon the plurality of stacked layers disposed upon the base layer interface the integrated circuits to external circuitry. Each of the stacked layers has a pattern of conductive conduits formed thereupon. Each aperture formed within a stacked layer has inclined sidewalls with conductive conduits formed thereon. The inclined sidewalls are formed to support the integrated circuit chips on beveled surfaces of the chips which are perpendicular to the beveled surfaces supported by the elongate bumps. The conductive conduits formed on the stacked layer sidewalls contact the pads formed upon these beveled surfaces of the integrated circuit chip. Thus, the integrated circuits are supported by and connected to the conductive conduits formed on the base layer and stacked layers solely by means of abutting electrical connection with the chip beveled edge portions.

A plurality of individual multilayer integrated circuit modules may be stacked to form a signal processing module which can be interfaced to an infrared detector array on one end and further signal processing circuitry on the opposite end as is common in the prior art.

The multilayer integrated circuit module of the Present invention may be formed such that the integrated chip circuit can be disposed entirely within the well to facilitate stacking of the modules. The chip of the TAI device extends above the well, thus complicating the stacking process.

These, as well as other advantageous of the present invention will be more apparent from the following description and drawings. It is understood that the changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The multilayer integrated circuit assembly of the present invention is illustrated in FIGS. 1-19 which depict three presently preferred embodiments of the invention.

Figure 20:
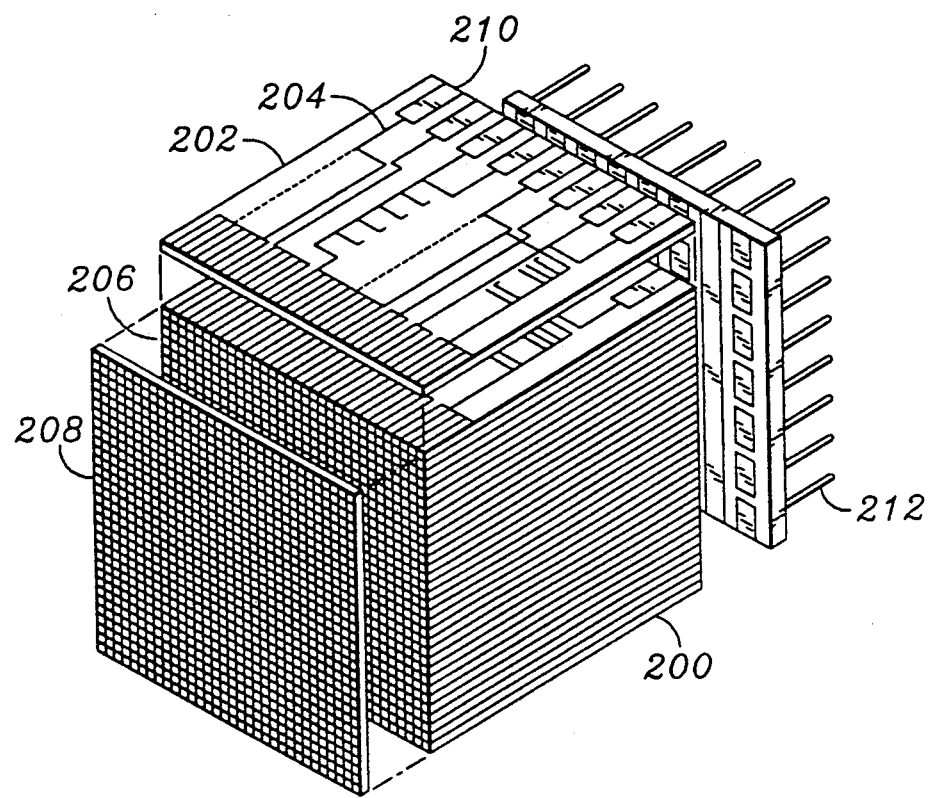
FIG. 20 is a perspective view of a prior art module showing how the module contacts an infrared detector array and a pin grid array mounting device.

FIG. 20 illustrates a prior art means for constructing a stacked integrated circuit module 200 and interfacing the module 200 to external circuitry. The integrated circuit module 200 is comprised of individual layers 202 adhesively bonded together and insulated from each other. The layers 202 of the stacked integrated circuit module 200 do not have wells formed therein, as in the present invention and in the TAI patent.

The stacked integrated circuit module 200 of FIG. 20 is presented to illustrate the concept of stacking in the prior art and to show the interface requirements (in this case, detector array to module, and module to pin grid array). An infrared detector array 208 is attached to input connectors 206 formed upon a first end of the module 200. A pin grid array connector 212 is similarly attached to a second end of the array 200. Thus, the prior art integrated circuit module provides a means for attaching integrated circuits to external circuitry. This module, however, has a number of disadvantages. The large number of closely packed processor circuits formed over the layer area results in a lower wafer fabrication yield than when a larger number of smaller area chips are used to perform the same circuit function. Placing these smaller area of chips in wells, which are formed in the layer laminate, makes possible the use of chips that can be as thick as the depth of the well rather than as thin as a layer. Larger area wafers can then be employed for more economical wafer fabrication processing. The use of the smaller area chips also easily permits different or a variety of circuits to be employed rather than a multiplicity of the same circuit. Though a chip-in well layout provides greater design flexibility, it can require a high density of space consuming chip-to-substrate bonds, which are conventionally wires or metal strips (TAB) bonded from the semiconductor chip to an alumina ceramic layer substrate.

The present invention employs a type of bump bond between the chips and a single crystalline silicon layer substrate to obtain a high density of input and output leads in a multilayer chip-in-well structure. The use of these silicon layers also provides a means of readily forming a high density of leads from input and output pads to the chip bonding pads at the edges of a well for generally applicable multilayer circuit assemblies rather than limited application to electro-optical modules. Thus, it would be desirable to provide a multilayer integrated circuit assembly wherein conductive conduits can be formed upon a plurality of layers to provide electrical pathways between external circuitry and a multiplicity of integrated circuits.

Figure 1:
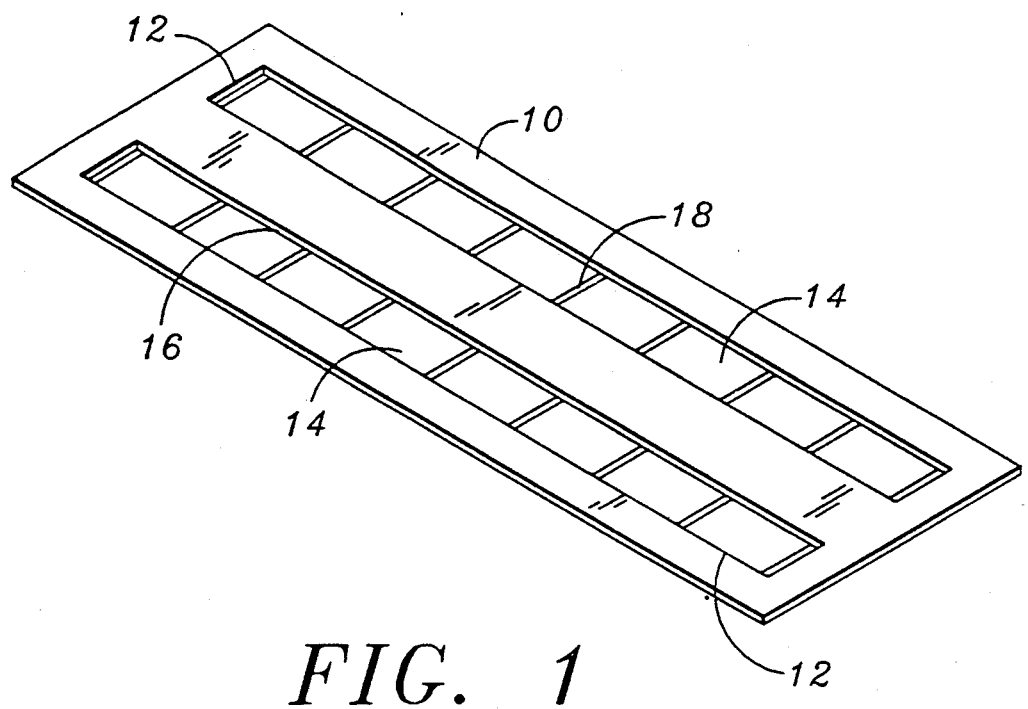
FIG. 1 is a perspective view of the substrate well assembly of a first embodiment of the multilayer integrated circuit module of the present invention.
Figure 2:
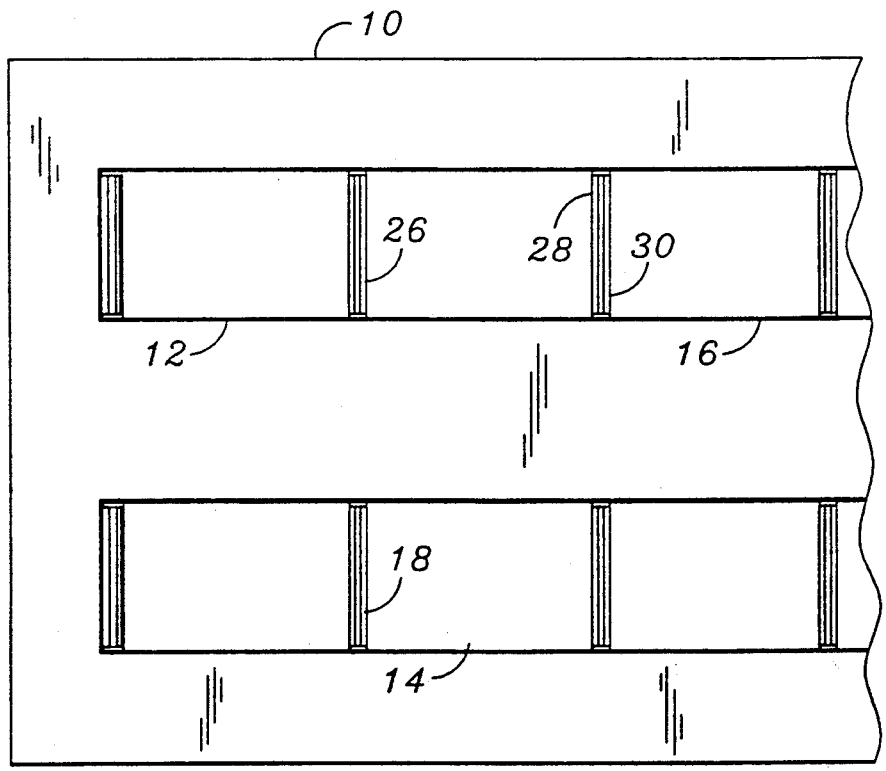
FIG. 2 is a top elevational view of a portion of the substrate well assembly of FIG. 1.
Figure 7:
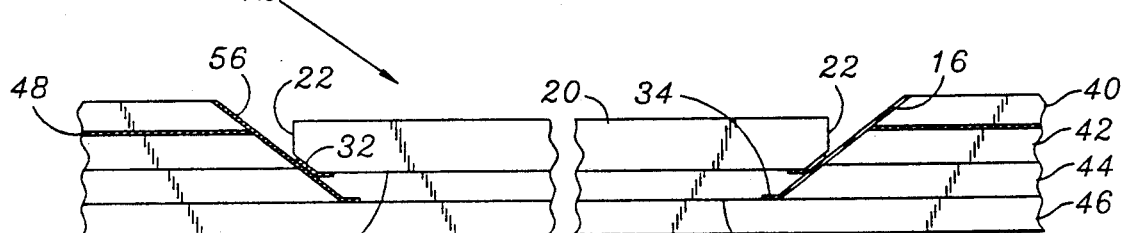
FIG. 7 is a cross-sectional side view of an integrated circuit chip disposed within the substrate well assembly showing the conductive pads formed upon the beveled surfaces of the integrated circuit chip contacting the conductive conduits formed upon the inclined sidewalls of the well, the conductive conduits formed upon the inclined sidewalls connected to conductive conduits formed upon the second upper layer.
Figure 8:
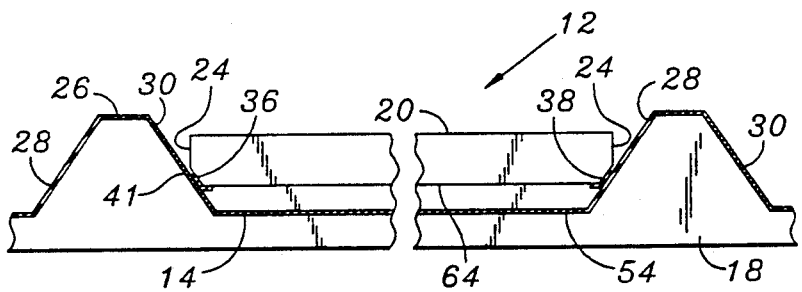
FIG. 8 is a cross-sectional side view of the integrated circuit chip disposed within the substrate well assembly showing the conductive pads formed upon the beveled surfaces of the integrated circuit chip contacting the conductive conduits formed upon the inclined sides of the elongate bumps of the base.
Figure 10:
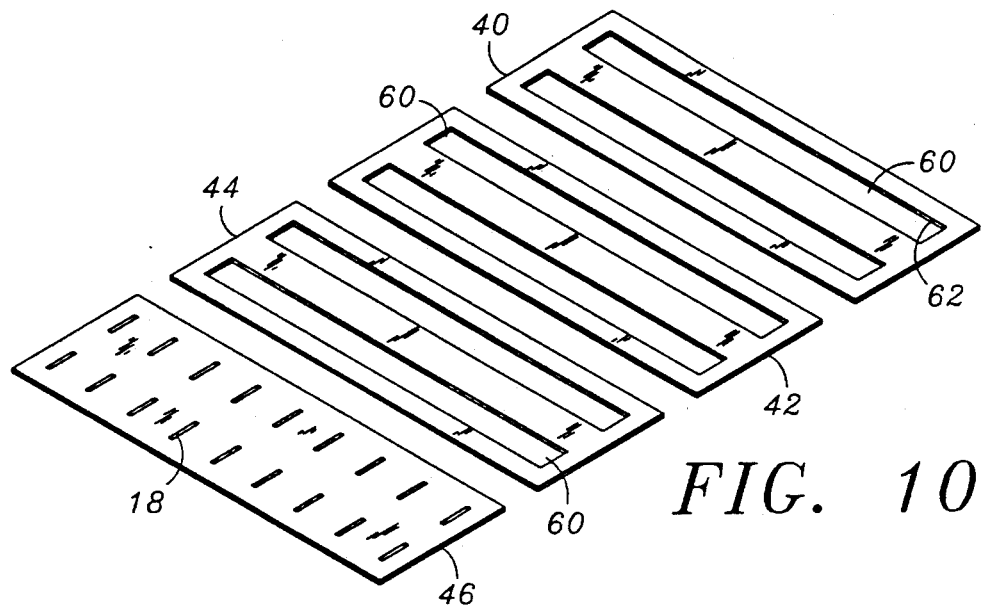
FIG. 10 is an exploded perspective view of the substrate well assembly showing the base layer and three upper layers.
Figure 11:
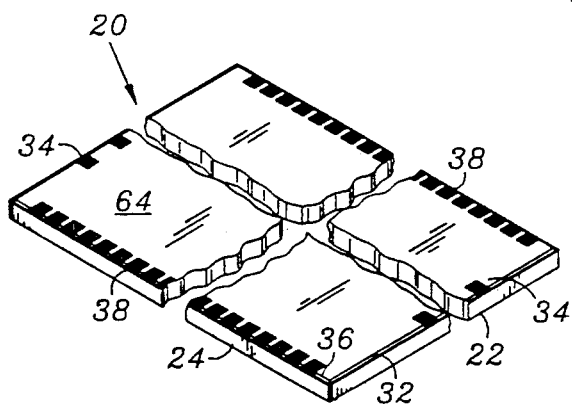
FIG. 11 is a sectional perspective view of the integrated circuit chip showing the conductive pads formed upon the beveled surfaces thereof for contacting to conductive conduits formed upon the inclined sides of the wells and of the elongate bumps.
Figure 15:
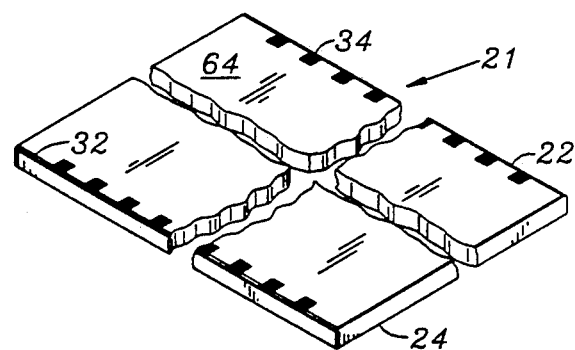
FIG. 15 is a sectional perspective view of the integrated circuit chip showing the conductive pads formed upon the beveled surfaces thereof for contacting the conductive conduits formed upon the inclined sides of the upper layers.

Referring now to FIGS. 2, and 10, a first embodiment for multilayer integrated circuit assembly is comprised generally of a substrate well assembly 10 having a plurality of wells 12 formed there.:n and an integrated circuit chip shown in FIGS. 7, 8, and 11. Those skilled in the art will recognize any number of wells 12, including a single well, may be suitable for a particular application.

Each well 12 is further comprised of a floor 14 and inclined sidewalls 16. Disposed within each well is a plurality of elongate bumps 18, which are shown in perspective in FIG. 6.

An integrated circuit chip assembly (shown in FIGS. 7, 8, and 11) is disposable within wells 12. Eight such integrated circuit chip assemblies 12 may be disposed within each well of the substrate well assembly of FIG. 1. Thus, a total of sixteen integrated circuit chip assemblies 20 may be disposed within the multilayer integrated circuit assembly of the present invention. Each integrated circuit chip 20 is approximately the same width as the wells 12 and approximately the length of the distance between elongate bumps 18, such that the sides 22 of the integrated circuit chip rest upon the inclined sidewalls 16 of the wells 12 and the ends 24 of the integrated circuit assembly rest upon the inclined walls 28 of the elongate bumps 18 when the integrated circuit chip 20 is disposed within a well 12.

Each elongate bump 18 has an upper surface 26 and inclined sides 28 and 30 (best shown in FIG. 8).

Referring now to FIG. 7, the multilayer well assembly 10 is formed from first, second and third upper layers 40, 42, and 44, respectively, and a base layer 46. The first 40, second 42, third 44, and base 46 layers cooperate to form the well 12. An integrated circuit chip 20 is shown disposed within the well 12. FIG. 7 illustrates how the integrated circuit chip 20 contacts the inclined sidewalls 16 of the well 12. The sides 22 of the integrated circuit chip assembly 20 have bevels 32 which conform to the angle of the inclined sidewalls 16. Contact pads 34 are formed upon side bevels 32 and extend a short distance onto the lower surface 64 of the integrated circuit chip assembly 20. The contact pads 34 provide electrical contact to conductive conduits 16 formed upon inclined sidewalls 16.

The inclined sidewalls of each of said stacked layers cooperate to form a plurality of common planes. For instance, the inclined sidewalls of the first 40, second 42, and third 44 layers cooperate to form the common planes of the two well sidewalls 16.

Referring now to FIGS. 7 and 8, the angles of the integrated chip bevels 32 and 36, the sidewalls 16 and the elongated bumps 30 are the same angle that is formed by anisotropically etching (100) oriented single crystalline silicon. Contact pads 38, similar to contact pads 34, are formed upon the end bevels 36 and provide electrical contact to conductive conduits 41 formed upon elongate bumps 18.

Figure 3:
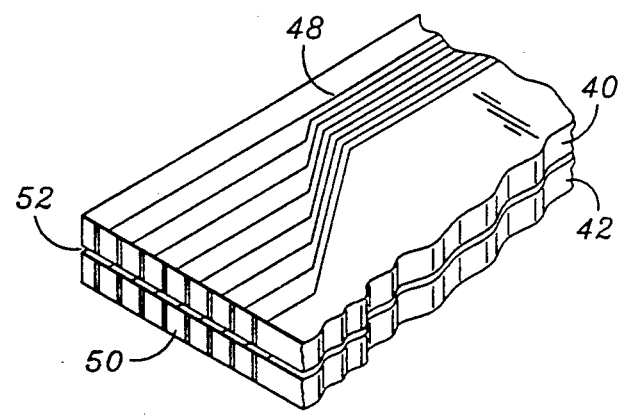
FIG. 3 is a sectional perspective view of two adjacent upper layers of the substrate well assembly showing the conductive conduits formed upon the surfaces thereof and the contact pads formed upon one end thereof for interfacing the multilayer integrated circuit module to external circuitry.

Referring now to FIG. 3, the first 40 and second 42 layers are illustrated. Traces or conductive conduits 48 are formed upon the upper surface of the first 40 and second 42 upper layers and connect to conductive contact pads 50 formed upon the first end 52 of the multilayer integrated circuit assembly. Conductive bumps (not shown) formed of a soft malleable material such as indium may be disposed upon contact pads 50 to facilitate connection of the multilayer integrated circuit assembly to, for example, a plane of detector elements.

Figure 4:
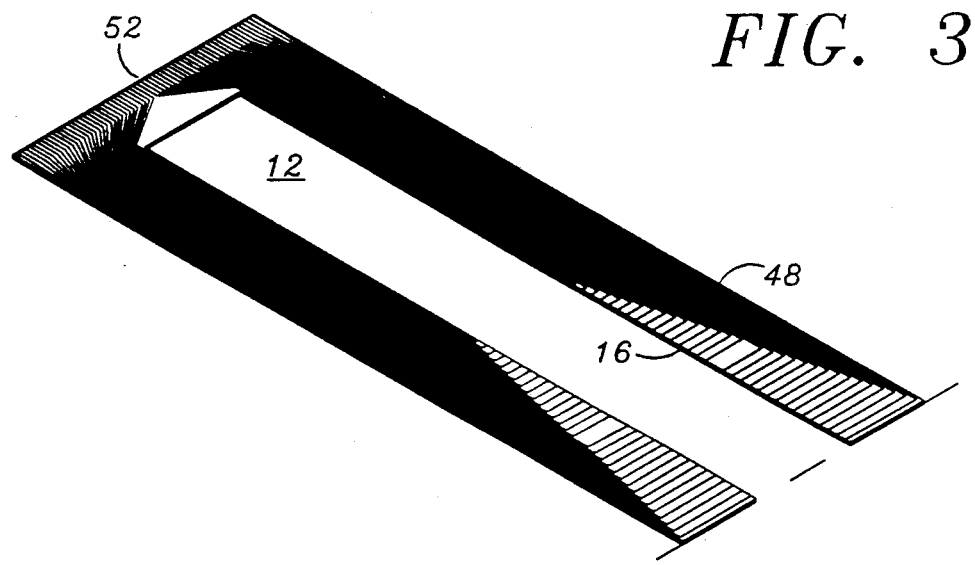
FIG. 4 is a sectional perspective view of one end of a single layer of the substrate well assembly showing conductive conduits of FIG. 3 extending from the end thereof to the inclined side walls of the well.

Referring now to FIG. 4, a portion of a single upper layer 40, 42, or 44 is depicted. Traces or conductive conduits 48 extend from the conductive contact pads 50 formed upon the first end 52 of the layer 40, 42 or 44 to the inclined sidewalls 16. Thus, paths are formed for electronic signals which may be received by the multilayer integrated circuit assembly at the conductive contact pads 50 and transmitted to an integrated circuit chip 20 (not shown in FIG. 4) disposed within the well 12. A plurality of such layers are adhesively stacked such that their inclined sidewalls cooperate to form a common well 12. The conductive conduits 48 formed upon layers 40, 42, or 44 provide a high density of signal pathways between the integrated circuit chip 20 and external circuitry. Sufficient conductive conduit width is maintained to assure proper current flow and the distance between individual conductive conduits is maintained sufficiently large to prevent adverse affects due to capacitance.

Figure 5:
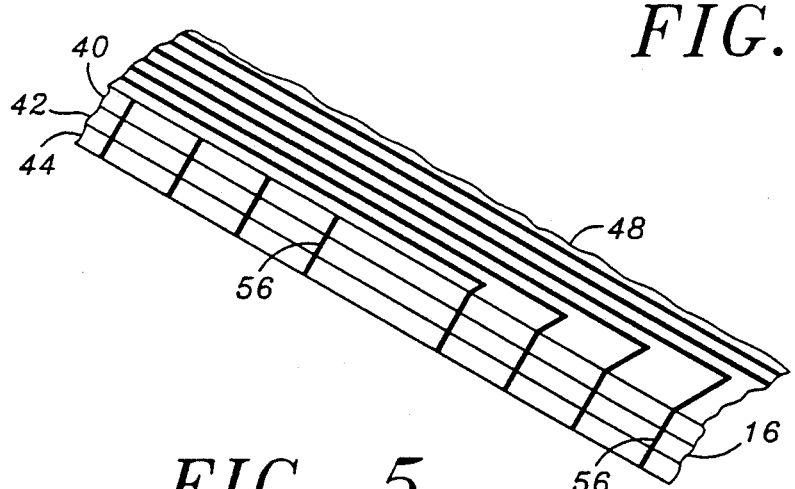
FIG. 5 is an enlarged sectional perspective view of three layers of the substrate well assembly showing the uppermost layer as in FIG. 4 and also showing the conductive conduits formed upon the inclined edges of each of the three layers.

Referring now to FIG. 5, the conductive conduits 48 are illustrated where they contact the inclined sidewalls 16. The conductive conduits 48 continue down along the inclined sidewalls 16 of the first 40, second 42 and third 44 upper layers.

Figure 6:
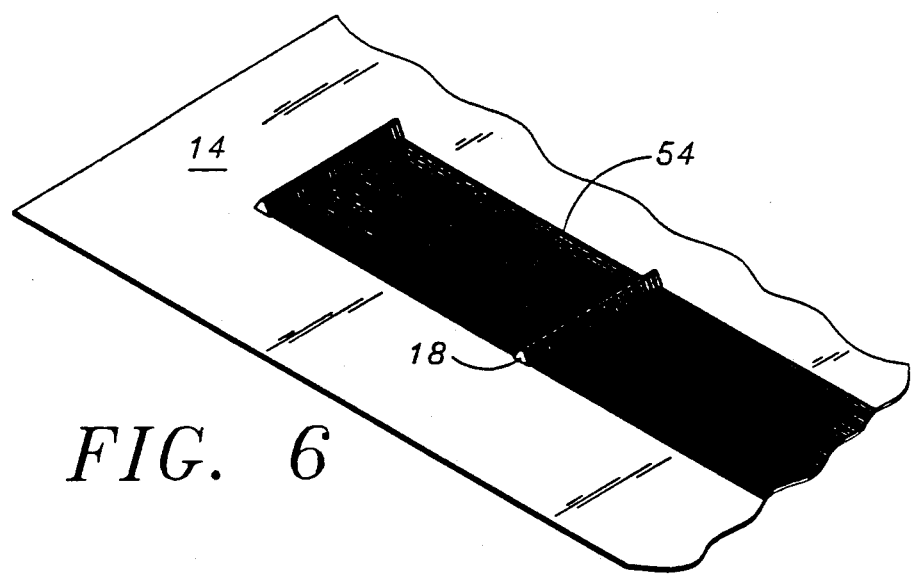
FIG. 6 is a sectional perspective view of the upper surface of the substrate well assembly base layer showing two elongate bumps formed thereon and a plurality of conductive conduits formed thereover.

Referring now to FIG. 6, conductive conduits 54 formed upon the floor 14 are illustrated. The conductive conduits 54 extend the length of wells 12 and are formed over elongate bumps 18. The conductive conduits 54 thus provide an electrical pathway to contact pads 38 formed upon bevels 36 of the integrated circuit chip 20. A single one of the conductive conduits 54 of FIG. 6 is illustrated in FIG. 8 as conductive conduit 41.

Figure 9:
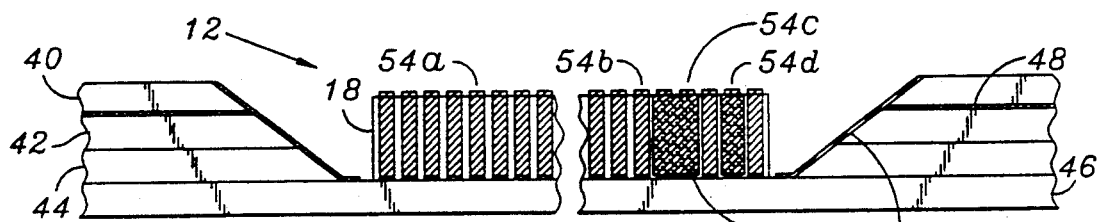
FIG. 9 is a cross-sectional side view of the substrate well assembly of FIG. 7 having the integrated circuit chip removed and showing conductive conduits formed upon the elongate bump, the second, fourth, and fifth conductive conduits from the right having an insulating layer formed thereupon.

Referring now to FIG. 9, conductive conduits 54 can be individually masked as they travel over elongate bumps 18 such that only the desired conductive conduits contact the integrated chip 20. For example, traces 54a and 54b are not masked while traces 54c and 54d are masked. That is, an insulating layer 58 can be formed over traces 54 to electrically insulate the traces 54 from conductive pads 38 formed upon the integrated circuit chip 20. This permits a series of identical chips to be used in a situation where individual chips are addressed by enabling selected conductive conduits 54. Enable or addressing signals will go only to those leads on the selected chips which are not masked. Thus, the conductive conduits 54 of FIG. 6 can be used as a bus to supply power, control, and addressing signals to integrated circuit chips 20.

In FIG. 7 conductive conduits 48 are formed between first 40 and second 42 uppermost layers. These conductive conduits 48 can extend to one or both ends of a multilayer integrated circuit assembly as described above. Each conductive conduit 48 connects to a conductive conduit 56 formed upon the inclined sidewall 16 of the well 12. Each conductive conduit 56 formed upon the inclined sidewalls 16 extends the entire height of the sidewall 16, i.e. across the first 40, second 42, and third 44 upper layers. Thus, the integrated circuit chip 20 can contact the conductive conduit 56 at any height, thereby making alignment less critical. Conductive conduits (such as 48) formed upon the surface of each layer 40, 42, and 44 contact only its respective conductive conduits formed upon the inclined sidewalls 16.

Referring now to FIG. 10, first 40, second 42 and third 44 upper layers and base layer 46 are illustrated in a perspective exploded view to show how they may be assembled to form a substrate well assembly. First the third upper layer 44 is adhesively bonded to the base layer 46, then the second upper layer 42 is adhesively bonded to the third upper layer 44, and finally the first upper layer 40 is adhesively bonded to the second upper layer 42. Each of the upper layers 40, 42 and 44 have two apertures 60 formed therein. Each apertures 60 has a sloped aperture wall 62. The apertures 60 of the upper layers 40, 42 and 44 cooperate to form the wells 12 in the assembled substrate well assembly. The sloped walls 62 of each aperture 60 are inclined at the same angle and positioned such that they cooperate to form contiguous inclined sidewalls 16 (as shown in FIG. 7).

Referring now to FIG. 11 the surface 64 which contains the integrated circuits of chip 20 is depicted. Conductive contact pads 34 and 38 are formed upon bevels 32 and 36, respectively. Each of the conductive contact pads 34 and 38 extend from the bevels 32 and 36 onto the lower surface 64 of the integrated circuit chip 20. That portion of the conductive contact pads 34 and 38 which extends onto the surface 64 of the integrated circuit chip 20 provides a convenient contact surface for test probing and burn in. The conductive contact pads 34 are spaced farther apart than the conductive contact pads 38 to accommodate contact on two sides of chip 20 to the conductive conduits 54 formed upon the elongate bumps 18.

Figure 12:
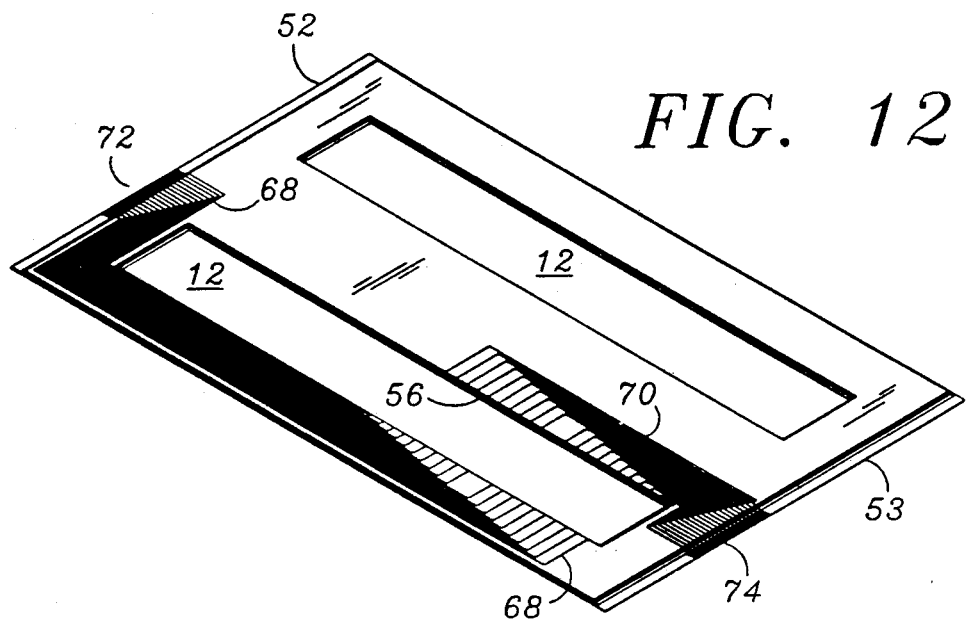
FIG. 12 is a perspective view of a multilayer integrated circuit module of the second embodiment of the present invention showing two upper layers formed upon a base layer and showing a first plurality of conductive conduits extending from a first end of the module to the well and a second plurality of conductive conduits extending from the well to the second end of the integrated circuit module.

Referring now to FIG. 12, a lead arrangement in a second embodiment of a multilayer integrated circuit assembly is illustrated. Input conductive conduits 68 provide electrical communication between input conductors 72 and the integrated circuit chip 21 of FIG. 15. Output conductive conduits 70 provide electrical communication between the integrated circuit chip 21 and output conductive contact pads 74. Thus, input signals may be provided to a first end 52 of the multilayer integrated circuit assembly and output signals may be taken from a second end 53 of the multilayer integrated circuit assembly. Input conductive conduits 68 and output conductive conduits 70 illustrated in FIG. 12 interface a single integrated circuit chip 20 to external circuitry and/or transducers. Similar conductive conduits may be formed upon other layers of the substrate well assembly to interface other chips. Thus, a high density of conductive conduits is formed to a plurality of integrated circuit assemblies.

The lead arrangement depicted in FIG. 12 is well suited for assemblies of a large number of interconnected integrated circuit chips with a large number of inputs and outputs, such as large memory or logic arrays. Each chip, unlike the electro-optical signal processor module depicted in FIG. 27, can perform a different rather than the same circuit function. Also, unlike the module depicted in FIG. 27, the input and output contact pads can b Ⓡlike those used in conventional circuit boards.

Figure 13:
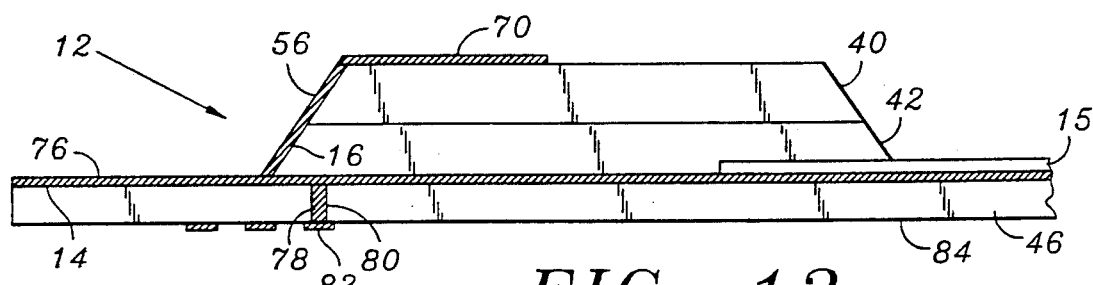
FIG. 13 is cross-sectional side view of the base layer and two upper layers of a substrate well assembly showing a conductive conduit formed within a via electrically connecting a conductive conduit formed upon the uppermost surface of the base layer to a conductive conduit formed upon the lowermost surface of the base layer.
Figure 14:
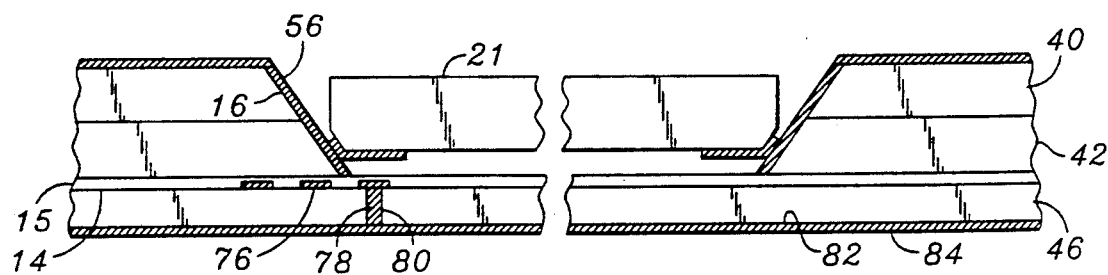
FIG. 14 is a cross-sectional side view of the substrate well assembly showing an integrated circuit chip disposed within the well, and showing a conductive conduit formed within a via electrically connecting a conductive conduit formed upon the uppermost surface of the base layer to a conductive conduit formed upon the lowermost surface of the base layer.
Figure 16:
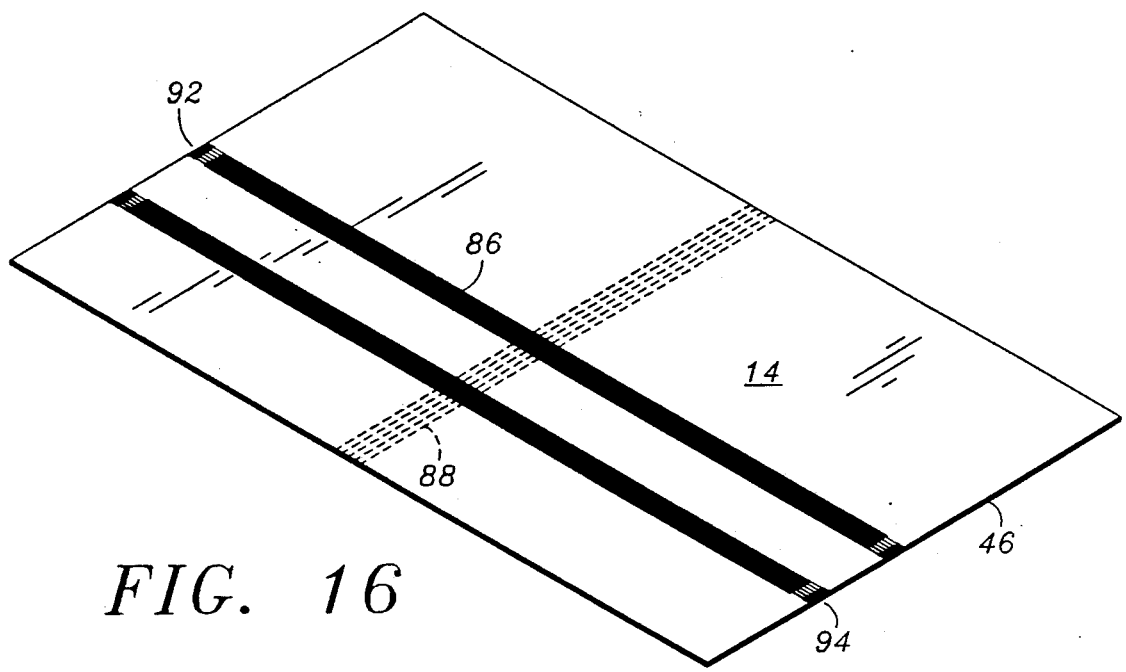
FIG. 16 is a perspective view of the base layer showing conductive conduits formed upon its uppermost surface in solid lines and showing perpendicular conductive conduits formed on the lowermost surface in dashed lines.

FIGS. 13 and 14 illustrate a general purpose method for interconnecting input and output conductive conduits formed upon the uppermost and lowermost surfaces of the base layer 46 such that various chips interconnections may be formed within the assembly. Generally, conductive conduits will be formed upon one surface of the base layer and perpendicular conduits will be formed upon the opposite surface as illustrated in FIG. 16. Vias are used to interconnect selected conductive conduits from the uppermost surface with selected conductive conduits upon the lowermost surface. Thus, signals can be conveniently communicated from any given trace formed on the uppermost surface of the base layer to any conductive conduit formed upon the lowermost surface of the base layer. This means of providing generalized interconnections using the base layer may be used in cooperation with the bus or conductive conduits 72 and 74 formed upon the upper layers as illustrated in FIG. 12.

Referring now to the cross-section of FIG. 13, at an edge 72 or 74, each conductive conduit 56 formed upon an inclined sidewall 16 and electrically connected to a conductive conduit 70 formed upon the surface of a layer 40 may further connect to a conductive conduit 76 formed upon the upper surface of the base layer 46. Such conductive conduits 76 also traverse the floor 14 of the well 12 laterally. Conductive conduits 78 formed within vias 80 connect selected lateral conductive conduits 76 to longitudinal conductive conduits 82 formed upon the lower surface 84. Thus, longitudinal 82 and lateral 76 conductive conduits may be interconnected as desired.

Referring now to FIG. 14 which depicts a cross-section at a well, longitudinal conductive conduits 76 are formed upon the floor 14 of the base layer 46 and then may be selectively connected to lateral conductive conduits 82 formed upon the lower surface 84 of the base layer 46. Insulating layer 15 formed upon the floor 14 of the base layer 46 insulate the longitudinal conductive conduits 76 from the conductive conduits 56 formed upon the inclined sidewalls 16 and from chip 21 metallization.

Referring now to FIG. 16, longitudinal conductive conduits 86 formed upon the upper surface or floor 14 of the base layer 46 are perpendicular to lateral conductive conduits 88 formed upon the lower surface 84 of the base layer 46. First 92 and second 94 conductive pads provide an interconnection means between the longitudinal conductive conduits 86 and external circuitry Selected longitudinal conductive conduits 86 and lateral conductive conduits 88 can be interconnected internally by using vias as discussed above.

Figure 17A:
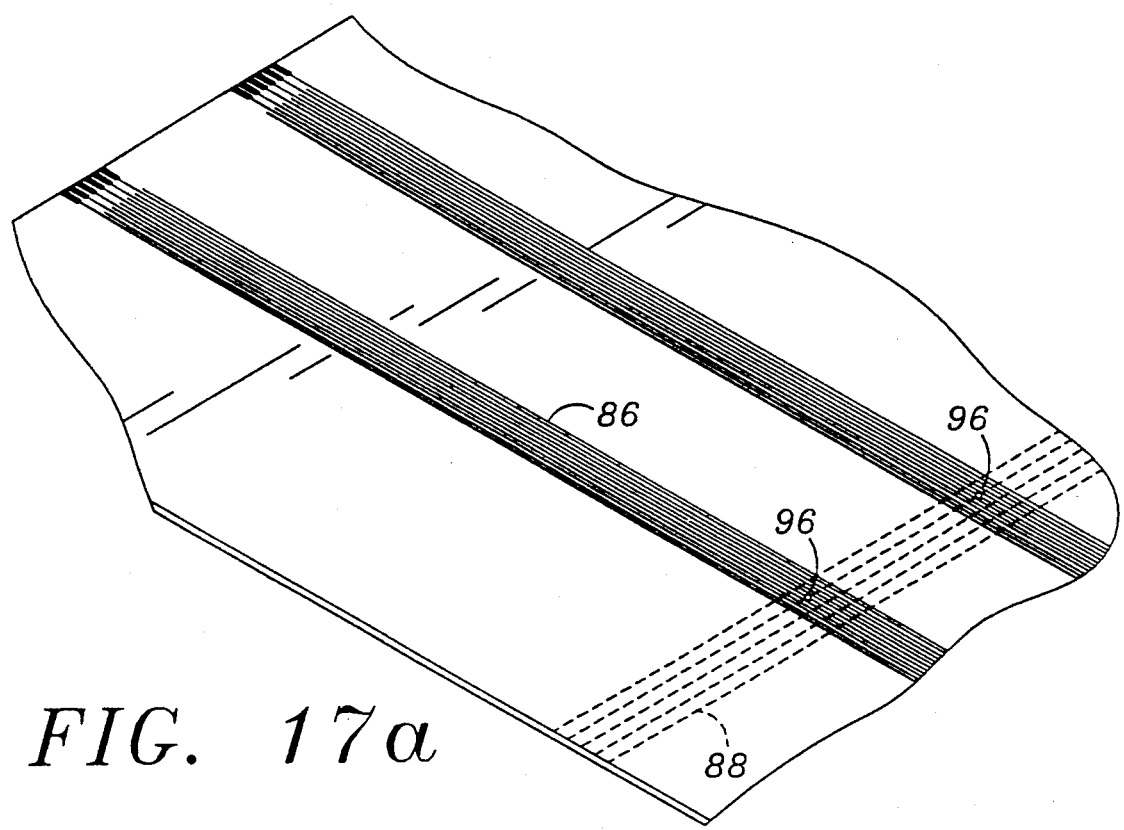
FIG. 17a is an enlarged sectional view of the base layer of FIG. 16 showing two vias connecting a conductive conduit formed upon the uppermost surface of the base to a conductive conduit formed upon the lowermost surface of the base.
Figure 17B:
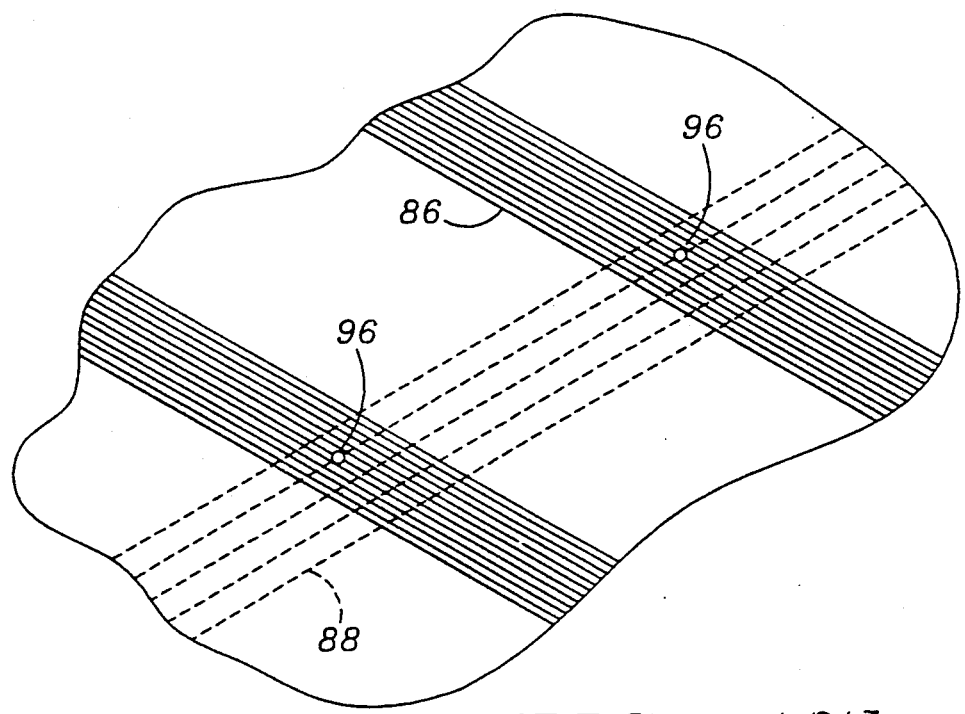
FIG. 17b is an enlarged sectional view of FIG. 17a showing the vias more clearly.

Referring now to FIGS. 17*a* and 17*b*, vias 96 having conductive conduits formed therein interconnect selected longitudinal conductive conduits 86 and lateral conductive conduits 88. Thus, a wide variety of interconnections can be easily and economically obtained in the multilayer integrated circuit assembly of the present invention. This can be accomplished while maintaining high circuit and trace density.

Figure 18:
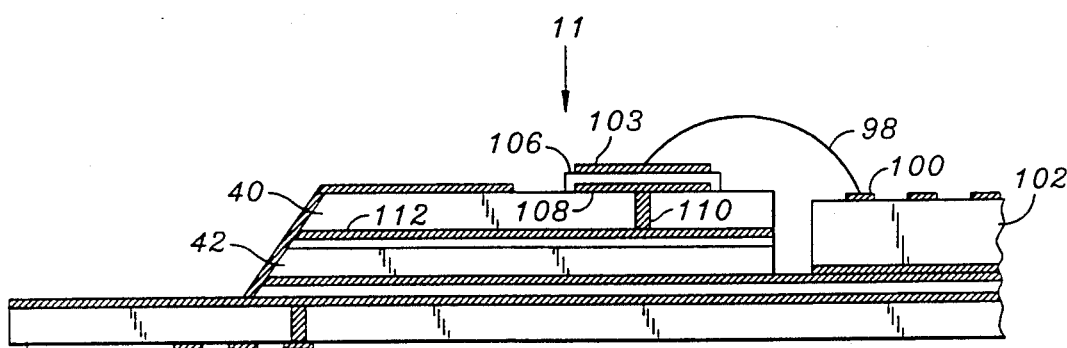
FIG. 18 is a cross-sectional side view of a substrate well assembly of a third embodiment of the multilayer integrated circuit assembly showing the interconnection of a high frequency semiconductor device hip to a thin film capacitor on the first upper layer of the substrate well assembly.
Figure 19:
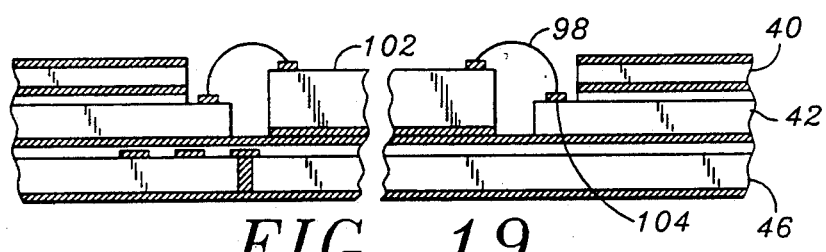
FIG. 19 is a cross-sectional side view of a third embodiment of the multilayer integrated circuit module showing the connection of a high frequency semiconductor device chip to the second upper layer of the substrate well assembly.

Referring now to FIGS. 18 and 19, a third embodiment of a multilayer integrated circuit assembly of the present invention can also be used to interconnect integrated circuit chips not having bevels and contact pads formed upon the lower edges thereof to a substrate well assembly. Such multilayer integrated circuit assemblies can likewise be stacked. Wire bonds 98 can connect contact pads 100 formed upon the semiconductor device 102 to contacts 104 formed upon the substrate well assembly 11 or to a thin film passive component 103 formed on assembly 11. Such interconnecting means are particularly applicable to high frequency, e.g. microwave semiconductor devices which need not be silicon devices. A capacitor may be formed by forming an insulating layer 106 intermediate the contact 104 and a second contact 108. A via 110 may be used to connect the second contact 108 of component 103 to a conductive conduit 112 formed upon an intermediate layer.

Referring to FIG. 19, the semiconductor device 102 can alternatively be connected to an intermediate or second layer 42 using wire bond 98.

It is understood that the exemplary multilayer integrated circuit assembly described herein and shown in the drawings represents only a presently preferred embodiment of the invention. Various modifications and additions may be made to such embodiment without departing from the spirit and scope of the invention. For example, the shape and general configuration of the wells may be varied to suit particular applications. Also, various conductive conduit layout patterns are possible. The present invention is not intended to be limited to those patterns depicted. Thus, these and other modifications and additions may be obvious to those skilled in the art and may be implemented to adapt the present invention for use in a variety of different applications.

I claim:

1. A multilayer integrated circuit module for supporting integrated circuit chips and interfacing the integrated circuit chips to external circuitry, the integrated circuit chips being formed to have conductive contact pads formed on beveled edge portions thereof, the module comprising:
    (a) a base layer having conductive conduits formed thereon, said base layer further having at least two inclined walls spaced to receive and support the integrated circuit along beveled edge portions thereof, said base layer conductive conduits extending along said inclined walls and in electrical communication with said integrated circuit chip conductive pads; and
    (b) at least one stacked layer formed of the same material as the base layer disposed upon said base layer also for interfacing the integrated circuits to external circuitry, each of said stacked layers having a conductive pattern formed thereon and at least one aperture extending therethrough, said apertures having inclined sidewalls with conductive conduits formed thereon, said inclined sidewalls being formed to support the integrated circuits along beveled edge portions thereof, said conductive conduits formed on the stacked layer sidewalls and being in electrical contact with integrated circuit pads;
    (c) wherein the integrated circuits may be supported by and connected to the conductive conduits formed on the base layer and stacked layers solely by means of abutting electrical connection with the chip beveled edge portions.

2. The multilayer integrated circuit module as recited in claim 1 wherein the base layer inclined walls are formed upon elongate bumps, said elongate bumps being formed upon said base layer.

3. The multilayer integrated circuit module as recited in claim 2 wherein the inclined sidewalls of said stacked layers cooperate to define a plurality of common planes.

4. The multilayer integrated circuit module as recited in claim 3 further comprising conductive contact pads formed upon at least one common end of said stacked layers for providing electrical communication to external circuitry.

5. The multilayer integrated circuit module as recited in claim 4 wherein said integrated circuit chip is disposable entirely within said module to permit the stacking of modules.

6. The multilayer integrated circuit module as recited in claim 3 wherein the conductive pattern formed upon at least one of said stacked layers further comprises:
    (a) a plurality of conductive contacts extending from conductive contact pads formed upon a first end of said stacked layer to a first inclined sidewall; and
    (b) a plurality of conductive contacts extending from a second inclined sidewall to conductive contact pads formed upon a second end of said stacked layer.

7. The multilayer integrated circuit module as recited in claim 6 further comprising insulating layers formed upon inclined walls to determining which conductive contacts make electrical connection to corresponding conductive pads formed upon said integrated circuit chip.

8. The multilayer integrated circuit module as recited in claim 7 further comprising:
    (a) at least one via formed in at least one of said stacked layers;
    (b) a conductive conduit formed in said vias, said conductive conduit providing electrical communication between the upper and lower surface of said stacked layer.

9. The multilayer integrated circuit module as recited in claim 2 wherein:
    (a) said conductive conduits formed upon said inclined sidewalls of said stacked layers extend across single ones of said stacked layers; and
    (b) conductive contacts are formed upon said integrated circuit chip at various heights such that said conductive contacts contact conductive conduits formed upon different ones of said stacked layers.

10. A multilayer integrated circuit module for supporting integrated circuit chips and interfacing the integrated circuit chips to external circuitry, the module comprising:
    (a) a base layer;
    (b) at least one stacked layer formed of a single crystalline material disposed upon said base layer for interfacing the integrated circuits to external circuitry, each of said stacked layers having a conductive pattern formed thereon;

(c) at least one aperture extending through each of said stacked layers, said apertures having inclined sidewalls;

(d) conductive conduits extending from the conductive pattern formed upon the stacked layers and along the inclined sidewalls to the integrated circuit chip;

(e) wherein said base layer and said stacked layer are formed of the same material; and (f) wherein the integrated circuit chip is supported within the aperture and connected to the conductive pattern formed on the stacked layers solely by means of abutting connection to the inclined sidewalls of the stacked layer.

11. The multilayer integrated circuit module as recited in claim 10 wherein the conductive conduits extending from the conductive pattern formed upon the stacked layers to the integrated circuit chip comprise wire bonds.

12. The multilayer integrated circuit module as recited in claim 11 wherein said integrated circuit chip is disposable entirely within said module to permit the stacking of modules.

13. The multilayer integrated circuit module as recited in claim 12 wherein the conductive pattern formed upon at least one of said stacked layers further comprises:

(a) a plurality of conductive contacts extending from conductive contact pads formed upon a first end of said stacked layer to a first inclined sidewall; and (b) a plurality of conductive contacts extending from a second inclined sidewall to conductive contact pads formed upon a second end of said stacked layer.

14. The multilayer integrated circuit module as recited in claim 13 further comprising:

(a) at least one via formed in at least one of said stacked layers;

(b) a conductive conduit formed in said vias, said conductive conduit providing electrical communication between the upper and lower surface of said stacked layer.

15. A process for forming a module for electrically and mechanically interfacing integrated circuits to external circuitry, the process comprising the steps of:

(a) forming a first single crystalline material at a desired thickness such that a planar base is formed;

(b) forming at least one raised elongate member upon the surface of the planar base, the raised elongate member having at least one inclined wall;

(c) forming an insulator coating upon the planar base;

(d) forming a second single crystalline material at a desired thickness;

(e) forming at least one well in the second single crystalline material, the well having inclined walls;

(f) cutting a plurality of layers from the second single crystalline material;

(g) forming an insulator coating upon the layers;

(h) forming a plurality of conductive conduits upon a plurality of the layers;

(i) bonding the plurality of layers and the base together such that a module having at least one well is formed, the well having inclined walls;

(j) forming a plurality of conductive conduits upon the inclined sidewalls of the wells such that the conductive conduits formed upon the inclined walls contact a plurality of the conductive conduits formed upon the layers;

(k) forming a third single crystalline material into a chip upon which integrated circuitry may be formed to have at least one first beveled edge, the third single crystalline materially being sized to be received by at least one well, the first beveled edges corresponding to the angle of the inclined sidewalls of the well such that the first beveled edges of the chip are substantially parallel to the inclined walls of the well when the chip is disposed within the well; and (l) forming at least one second beveled edge upon the third single crystalline material, the second beveled edges corresponding to the angle of the inclined walls of the raised elongate members such that the second beveled edges of the chip are substantially parallel to the inclined walls of the raised elongate members when the chip is disposed within the well.

(m) wherein the steps of forming a plurality of conductive conduits upon the etched surface of the base and forming a plurality of conductive conduits upon the inclined sidewalls of the wells provide a means of communicating signals between the integrated circuits and external circuitry.

16. The process as recited in claim 15 wherein:

(a) the step of forming a first single crystalline material at a desired thickness comprise grinding the first single crystalline material;

(b) the step of forming at least one raised elongate member comprises anisotropically etching at least one surface of the planar base;

(c) the step of forming a second single crystalline material at a desired thickness comprises grinding the second single crystalline material;

(d) the step of forming at least one well in the second single crystalline material comprises anisotropically etching the second single crystalline material;

(e) the step of forming a third single crystalline material into a chip comprises anisotropically etching the third single crystalline material; and (f) the step of forming at least one second beveled edge upon the third single crystalline material comprises anisotropically etching the third single crystalline material.

17. The process as recited in claim 16 further comprising the step of forming a plurality of conductive conduits upon the etched surface of the base, the conductive conduits extending across the raised elongate members.

18. The process as recited in claim 17 wherein the step of forming a plurality of conductive conduits upon the inclined sidewalls comprises forming conductive conduits which extend over a plurality of layers and provide electrical communication therebetween.

19. The process as recited in claim 18 further comprising the steps of:

(a) forming a plurality of recesses within the lower surface of at least one of said stacked layers, said recess being formed at the inclined sidewall where conductive conduits terminate;

(b) forming a corresponding number of recesses within the upper surface of a corresponding number of said stacked layers, said recesses being formed at the inclined sidewall where conductive conduits terminate; and (c) depositing conductive material within said recesses;

(d) wherein electrical contact between conductive conduits formed upon the inclined sidewalls at adjacent layers is enhanced by the increased surface area provided by the conductive material deposited within the recesses.

20. The process as recited in claim 16 wherein the step of forming a plurality of conductive conduits upon the inclined sidewalls comprises forming conductive conduits which extend over a single layer and which are electrically isolated from conductive conduits formed upon adjacent layers.

21. The process as recited in claim 16 wherein the step bonding the plurality of layers and the base together such that a module having at least one well is formed comprises forming a well of sufficient depth that the integrated circuit may be disposed entirely therein to facilitate stacking.

22. A multilayer integrated circuit module as recited in claim 1 wherein said base layer and said at least one stacked layer are formed of a single crystalline material.

23. The multilayer integrated circuit module as recited in claim 22 wherein said base layer and said at least one stacked layer are formed of silicon.

24. The multilayer integrated circuit module as recited in claim 10 wherein said base layer and said at least one stacked layer are formed of the same single crystalline material.

25. The multilayer integrated circuit module as recited in claim 24 wherein said base layer and said at least one stacked layer are formed of silicon.

* * * * *